United States Patent [19]
Khan et al.

[11] Patent Number: 5,959,499
[45] Date of Patent: Sep. 28, 1999

[54] PREDISTORTION SYSTEM AND METHOD USING ANALOG FEEDBACK LOOP FOR LOOK-UP TABLE TRAINING

[75] Inventors: Andrew Merritt Khan, Schaumburg; George Francis Opas, Park Ridge, both of Ill.

[73] Assignee: Motorola, Inc., Schaumburg, Ill.

[21] Appl. No.: 08/940,492

[22] Filed: Sep. 30, 1997

[51] Int. Cl.[6] .................................................. H03F 1/26
[52] U.S. Cl. ................................. 330/149; 455/126
[58] Field of Search ......................... 330/2, 129, 149; 455/115, 126

[56] References Cited

U.S. PATENT DOCUMENTS

| | | | |
|---|---|---|---|
| 5,049,832 | 9/1991 | Cavers | 330/149 |
| 5,507,014 | 4/1996 | Wray et al. | 455/126 X |
| 5,524,285 | 6/1996 | Wray et al. | 330/149 X |
| 5,524,286 | 6/1996 | Chiesa et al. | 455/126 |
| 5,732,333 | 3/1998 | Cox et al. | 455/126 |
| 5,748,678 | 5/1998 | Valentine et al. | 330/149 X |

OTHER PUBLICATIONS

"Adaptive Linearisation Using Pre-Distortion" by Michael Faulkner, Thomas Mattsson, Warren Yates. IEEE 1990.

*Primary Examiner*—Steven Mottola
*Attorney, Agent, or Firm*—Darleen J. Stockley

[57] ABSTRACT

The present invention provides a linearization system (100) and method (700, 800) for generating a predistorted drive signal for a nonlinear transmission path. The linearization includes: A) an analog feedback system (39), coupled to a computation unit, for determining, during a training mode, a complex error signal that linearizes the nonlinear transmission path and wherein, in an operation mode, the analog feedback system is disabled; and B) a computation unit (1), coupled to the analog feedback system and coupled to receive a complex input signal and the complex error signal, for determining, during the training mode, complex predistortion gain coefficients and, during the operation mode, generating the predistorted drive signal for the nonlinear transmission path, wherein the analog feedback system and computation unit are interconnected by interface circuitry.

5 Claims, 5 Drawing Sheets

300

PREDISTORTION SYSTEM AND METHOD USING ANALOG FEEDBACK LOOP FOR LOOK-UP TABLE TRAINING

FIELD OF THE INVENTION

The present invention relates to predistortion systems and more particularly to a combination of a predistortion system and an analog feedback system.

BACKGROUND OF THE INVENTION

Numerous linearization circuits exist for reduction of intermodulation (IM) signal distortion for power amplifiers (PAs) using real-time analog feedback. However, moderate and large bandwidth systems suffer from instability problems due to incidental circuit delays when present analog feedback systems are used to lower IM signal distortion.

While digital predistortion systems for power amplifiers avoid the instability problems of the analog feedback systems, digital systems typically require the use of look-up tables, where the look-up tables consist of an inverse mapping of the power amplifier non-linearity. The inverse mapping is applied to a linear input signal and results in a linearized power amplifier output. The look-up table is regularly updated to adapt to changing characteristics of the power amplifier, typically utilizing digital signal processing. An iterative error minimization algorithm seeking to minimize the difference between a reference and the power amplifier output is generally used for the digital signal processing. However, use of such an algorithm often results in convergence problems for an arbitrary power amplifier.

Thus, an alternative system and method are needed for acquiring gain coefficients for providing a predistorted drive signal for a nonlinear transmission path.

DETAILED DESCRIPTION OF A PREFERRED EMBODIMENT

The present invention provides a predistortion system and method for using an analog feedback loop that generates and adapts a look-up table that provides error correction to improve IM distortion due to non-linearities of a typical radio frequency power amplifier. During an off-line training period, a narrow-bandwidth analog feedback loop is applied to the system to be linearized. The bandwidth of the loop is set to provide appropriate gain and phase margin levels to ensure adequate stability of the system. A slowly varying, wide dynamic range input signal is applied to the system from a computation unit, and the resultant error signal occuring at the summing junction is sampled and sent to the computation unit input. Under these conditions, the mapping of the computation unit output to the computation unit input results in a digitally-based look-up table that linearizes the power amplifier in real-time predistortion operation. The improved IM distortion reduces undesired spectral regrowth of a transmitter signal that is required to operate within an assigned bandwidth.

The present invention combines the advantages of both an analog feedback system and digital predistortion techniques to produce a transmitter with improved linearity while maintaining immunity to instability during normal operation. An advantage of the present invention is that the analog feedback system is completely independent of the real-time system operation. Thus, narrowband feedback, which is inherently more stable than a wideband feedback system needed to accommodate a full system bandwith plus IM distortion of a wideband signal, can be used. After the look-up table is obtained, any arbitrary bandwidth signal may be applied through the look-up table, and the required linearization of the system will be obtained. Furthermore, the computation load on the computation unit is reduced because, in the present invention, only one iteration of the look-up table is required for training in contrast to the prior art methods which may require several iterations.

Figure 1:
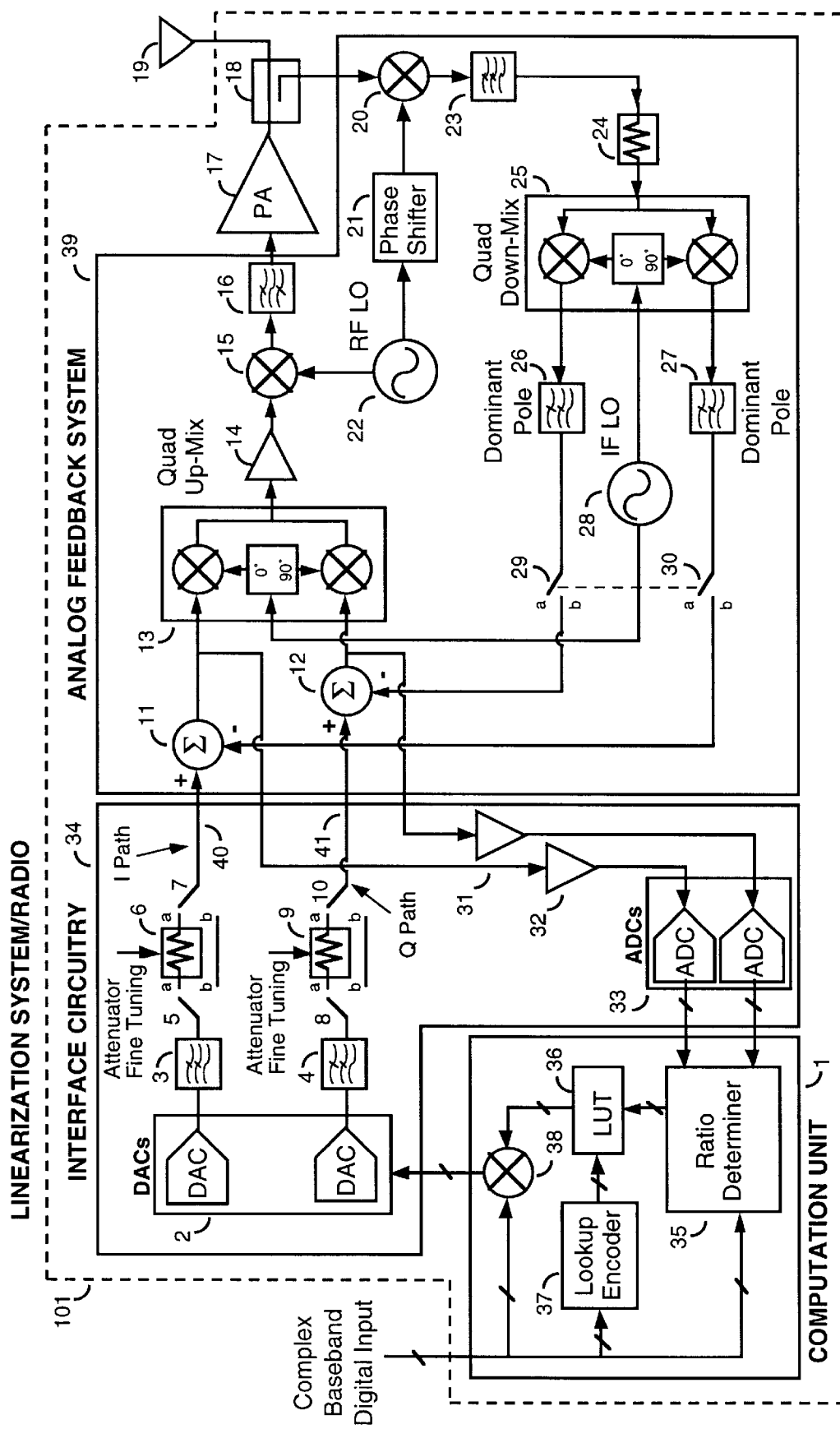
FIG. 1 is a block diagram of a preferred embodiment of a system in accordance with the present invention.

FIG. 1, numeral 100, is a block diagram of a preferred embodiment of a system in accordance with the present invention. A complex baseband input signal is supplied to the computation unit (1) and is initially passed without modification to two digital to analog converters (DACs) (2), low-pass filtered in reconstruction filters (3, 4), passed through switched attenuators (6, 9), and applied to a conventional Cartesian feedback loop (39). The Cartesian feedback loop in the preferred embodiment uses a quadrature upmixer (13) to generate a full composite IF signal using the local oscillator IF LO (28) and the baseband I and Q signals on the I Path (40) and Q Path (41) respectively. A buffer amplifier (14) provides some amount of gain to the composite signal before inputting it to a simple mixer (15) driven by the local oscillator RF LO (22). The upconverted signal is processed to remove mixing products using a filter (16) before being applied the to PA (17), which is typically the main source of nonlinearity. The PA output signal is primarily sent to the transmit antenna (19), but a small amount is sampled with a coupler (18) and used to create the feedback signal. This signal is mixed down to an IF using a simple mixer (20) and the mixing products are removed using a filter (23). An arbitrary phase shift through the loop is achieved by performing this mixing with the local oscillator RF LO (22) that has been processed through a phase shifter (21). The phase shift is adjusted to provide nominally 180 degrees of phase shift around the loop as measured at the summing junctions (11, 12). The resulting, phase shifted, IF signal is reduced in amplitude using an attenuator (24) and mixed down to baseband I and Q signals using a quadrature downmixer (25) driven by the local oscillator IF LO (28). Filtering using dominant poles (26, 27) limits the bandwidth of the analog feedback system (39), thereby maintaining system stability. The baseband feedback signals are summed together in the summing junctions (11,12) with the baseband I and Q reference signals on the I Path (40) and Q Path (41) respectively to complete the feedback loop. To create or update a look-up table, switches (5, 7, 8, 10, 29 and 30) are in a closed (b) position. When the phase shift through the loop reaches a predetermined value near 180°, a classic analog feedback circuit is formed that improves the linearity of all elements in the forward path from the output from the summing junctions (11, 12) to the output of the power amplifier (17). Under these conditions, the improvement in linearity is equal to the amount of loop gain from the summing junction output to its feedback input. The signal developed at the output of the summing junctions is typically called an "error" signal in feedback theory, but it is also in fact the "predistorted" signal required to generate a linear power amplifier output. This "error" signal is increased in level using amplifiers (31, 32) and then sampled using an analog-to-digital converter unit (33) before being returned to the computation unit (1). At predetermined levels of the input training signal, the complex "error" signal is employed to generate the required digital predistortion look-up table (LUT, 36).

An inherent advantage of digital predistortion is the fact that it is a completely open-loop linearization technique, and therefore avoids stability issued that might be encountered in a feedback system. Negative feedback techniques, on the other hand, are commonly used to correct analog nonlinearities, but are always faced with a tradeoff between system bandwidth and stability. To ensure stability a dominant pole is usually placed in an analog feedback system to provide gain margin by attenuating high-frequency loop gain. This precludes phase shifts arising through the action of circuit parasitics from generating positive feedback (instability) at some arbitrary offset frequency. By using a dominant pole, however, the system is necessarily restricted in its useful operating bandwidth. Various loop compensation techniques can be used to increase bandwidth, but ultimately a tradeoff between operating bandwidth and stability is encountered. The practical limit of analog feedback applied to an RF power amplifier is on the order of several hundred kHz. By using narrowband analog feedback only during a temporary offline training period and then switching to digital predistortion, the system's operating bandwidth is not limited by these loop stability issues. In practical operation, the linearity improvement in the predistortion mode will be comparable to that achieved in the analog feedback mode; however, the bandwidth of the signals handled will be significantly wider.

During the system training mode, the analog feedback mode is enabled and the system is driven with a number of discrete input levels over the dynamic range of the RF power amplifier. These input levels are stepped at a rate that is slow enough to allow the feedback system's transient response to settle to within an error of its final value that is based on the desired off-channel performance of the system. At each of these levels, as indexed by the lookup encoder (37), the measured values at the outputs of summing junctions (11, 12) are compared to the input of the computation unit (1) in the ratio determiner (35) to generate a complex look-up table gain multiplier value which is stored in the look-up table (36). Because only one iteration through each of the training levels is required, the present invention provides significantly faster training times than is possible with a purely algorithmic approach such as those proposed in the prior art. Furthermore, lower processor loading will result because the primary operations are reduced to coordinate conversion, look-up table indexing, and a complex multiply. In contrast, simulations of other algorithms known in the art indicate that several iterations are typically required to achieve satisfactory training. Some algorithms also encounter convergence problems in the presence of unfavorable power amplifier characteristics.

During normal predistortion operation, the analog feedback loop is opened and each sample of the random input signal to the computation unit (1) indexes a predetermined look-up table value which is then used to multiply the input signal, thus generating a linear power amplifier output response. Apart from the bandwidth capability of the digital-to-analog converters (DACs) (2) and the RF bandwidth of the forward path (summing junctions (11, 12) to the output of the power amplifier (17)), the speed of the input signal and bandwidth of the system during this predistortion mode of operation are limited only by the computational speed of the computation unit (1). The system bandwidth must of course be wide enough to include all the significant distortion products generated by the power amplifier.

To maintain good performance during predistortion operation, the signal level reaching the inputs of the Quad Up-Mix block (13) for a particular input level must be identical to the signal level present during the training mode. To achieve this, all switches are simultaneously moved to open (a) positions, and the computation unit (1) begins multiplying the input signal by the complex look-up table gain coefficients. Particular attention needs to paid to the level of the signal reaching the inputs of the nonlinear system at the Quad Up-Mix block (13), because when feedback is removed, this level rises by the amount of loop gain represented by blocks 13 through 17 (the forward path) and by blocks 18 through 26, 27 (the feedback path). To maintain maximum dynamic range throughout the digital signal processing path, analog attenuators (6, 9) are inserted after reconstruction filter blocks (3, 4) while the computation unit continues to provide predistorted signals with peaks near its full-scale output capability. Fine tuning of the attenuators (6, 9) is necessary to compensate for minor variations in nominal loop gain that can be expected with analog circuitry. A convenient time to perform this fine tuning is during the short interval after the training mode is completed and just prior to the predistortion mode starting. For example, while the input to the computation unit is held constant, the switches (3, 4, 7, 10, 29, 30) are moved to their "a" positions while the computation unit (1) applies the predistortion LUT value for that level. The attenuators are then fine-tuned to provide exactly the same level at the computation unit input as was seen during training with the analog feedback in place. To maintain maximum resolution in the analog to digital converters (ADCs) (33), this tuning is performed at the highest LUT index-corresponding to the highest power training level.

The linearization system/radio (101) of the present invention provides a predistorted drive signal for a nonlinear transmission path that typically includes a power amplifier. The linearization system/radio (101) includes: A) an analog feedback system (39) that includes the nonlinear transmission path, coupled to the computation unit, for determining the complex error signal that linearizes the nonlinear transmission path; and B) a computation unit (1), coupled to the analog feedback system and coupled to receive a complex input signal and a complex error signal, for determining a magnitude of the complex input signal and generating the predistorted drive signal for the nonlinear transmission path that includes the power amplifier, wherein the analog feedback system and computation unit are interconnected by interface circuitry (34).

The computation unit (1), may be selected to include: A) a ratio determiner (35), coupled to the interface circuitry (34), and to receive the complex input signal, for determining a complex look-up table coefficient corresponding to a preselected power level; B) a lookup encoder (37), coupled to receive the complex input signal, for determining a magnitude of the complex input signal and generating an index based on the magnitude of the complex input signal and a preselected set of levels; C) a look-up table (36), coupled to the ratio determiner and the lookup encoder, for outputting the complex look-up table coefficient corresponding to the index; and D) a multiplier (38), coupled to receive the complex input signal and the complex look-up table coefficient, for multiplying the complex input signal and the complex look-up table coefficient to provide the predistorted drive signal. Where selected, the preselected set of levels is based on steps of the input signal magnitude.

Figure 2:
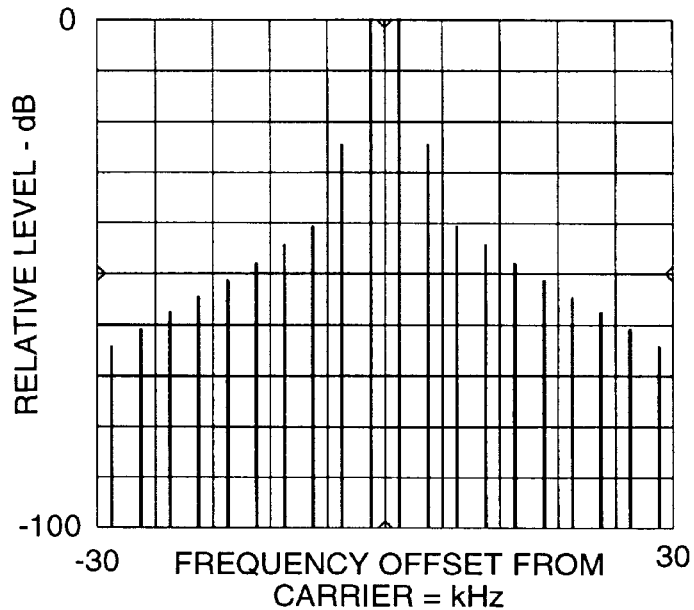
FIG. 2 is graphic representation of the two tone spectrum produced by nonlinear amplifier as is known in the art.

FIG. 2, numeral 200, is graphic representation of the two tone spectrum produced by a nonlinear amplifier as is known in the art. This shows the undesired out-of-band interference which is destructive to neighboring radio systems. The frequency scale shown in FIG. 2, as well as in FIGS. 3 and 6, ranges from −30 kHz to +30 kHz and represents a typical narrowband application. However, similar distortion spectra are generally produced by non-linear amplifiers over a wide range of bandwidths from a few Hz to tens of MHz.

Figure 3:
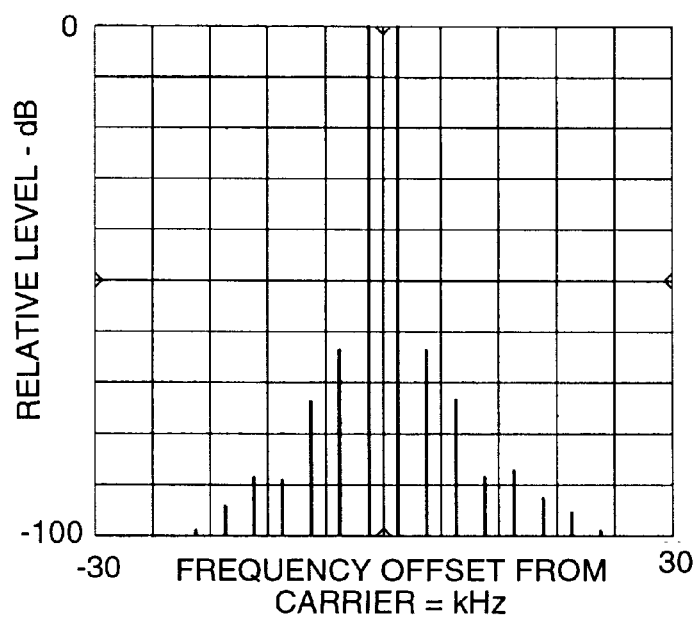
FIG. 3 is a graphic representation showing spectral improvement over a nonlinear amplifier with the application of analog feedback as is known in the art.

FIG. 3, numeral 300, is a graphic representation showing spectral improvement over a nonlinear amplifier with the application of analog feedback as is known in the art. This shows the typical improvement that can be achieved with analog feedback.

Figure 4:
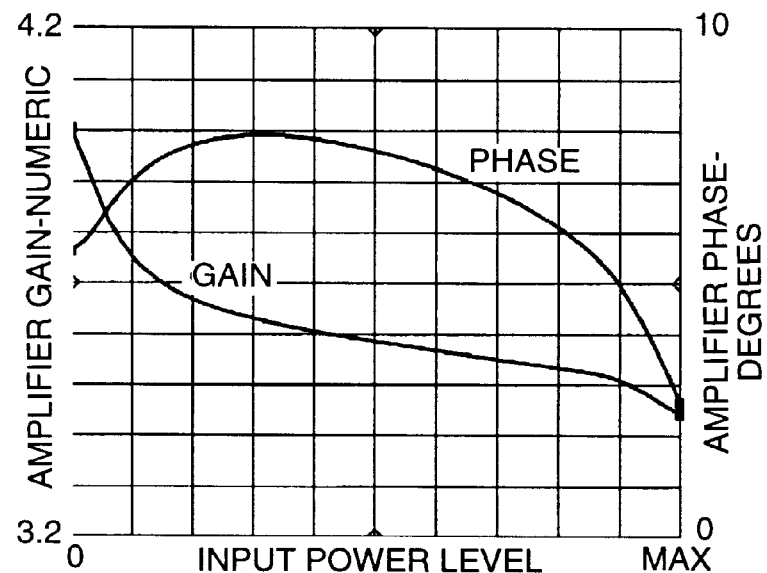
FIG. 4 is a graphic representation showing the amplifier gain and phase response vs. input power level of a nonlinear amplifier as is known in the art.

FIG. 4, numeral 400, is a graphic representation showing the amplifier gain and phase response vs. input power level of a nonlinear amplifier as is known in the art. When a radio signal with a nonconstant envelope is applied to such responses, spectral regrowth depicted in FIG. 2 occurs.

Figure 5:
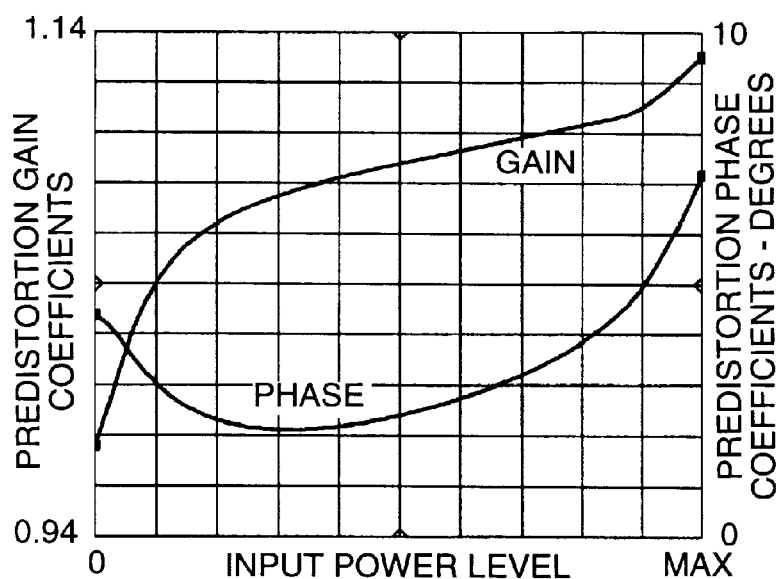
FIG. 5 is a graphic representation showing predistortion gain coefficients vs. input power level required to linearize the nonlinear amplifier where the predistortion gain coefficients are determined in accordance with the present invention.

FIG. 5, numeral 500, is a graphic representation showing predistortion gain coefficients vs. input power level required to linearize the nonlinear amplifier where the predistortion gain coefficients are determined in accordance with the present invention. The predistortion gain coefficients in FIG. 5 are a plot of coefficients which, when combined with the power amplifier response of FIG. 4, results in improved linearity of the overall response.

Figure 6:
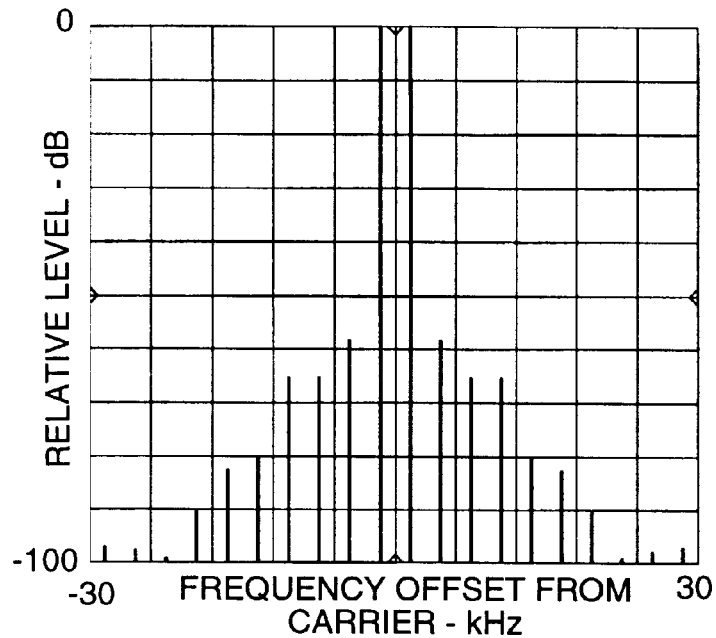
FIG. 6 is a graphic representation showing spectral improvement nonlinear amplifier spectrum shown in FIG. 2, where the predistortion coefficients are determined in accordance with the present invention.

FIG. 6, numeral 600, is a graphic representation showing spectral improvement over a nonlinear amplifier spectrum shown in FIG. 2, where the predistortion coefficients are determined in accordance with the present invention. This spectral improvement is achieved when a radio signal is applied to combined responses of FIG. 4 and FIG. 5.

Figure 7:
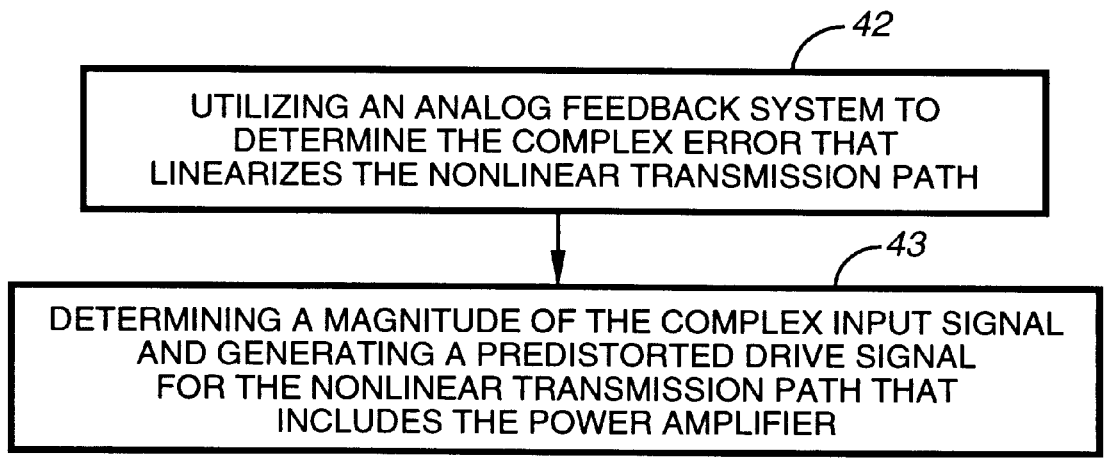
FIG. 7 is a flow chart showing one embodiment of the steps in accordance with the method of the present invention.

FIG. 7, numeral 700, is a flow chart showing one embodiment of the steps in accordance with the method of the present invention. The method provides for generating a predistorted drive signal for a nonlinear transmission path that includes a power amplifier. The steps include: A) utilizing (42) an analog feedback system to determine the complex error signal that linearizes the nonlinear transmission path; and B) determining (43) a magnitude of the complex input signal and generating a predistorted drive signal for the nonlinear transmission path that includes the power amplifier.

Figure 8:
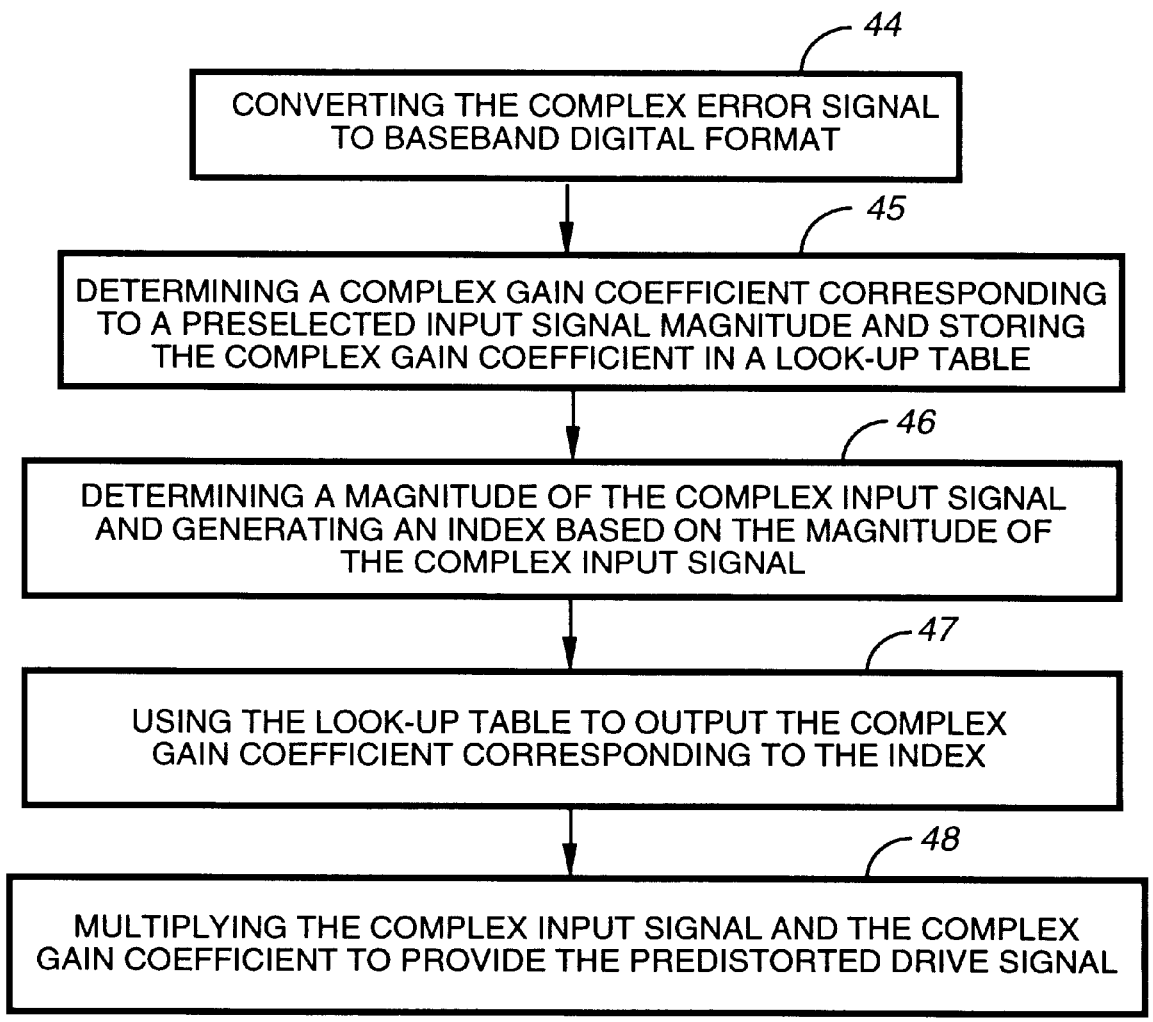
FIG. 8 is a flow chart showing one embodiment of steps of determining a magnitude of the complex input signal and generating a predistorted drive signal for the nonlinear transmission path in accordance with the present invention.

FIG. 8, numeral 800, is a flow chart showing one embodiment of steps of determining a magnitude of the complex input signal and generating a predistorted drive signal for the nonlinear transmission path in accordance with the present invention. Determining a magnitude of the complex input signal and generating a predistorted drive signal for the nonlinear transmission path generally includes: A) converting (44) the complex error signal to baseband digital format; B) determining (45) a complex gain coefficient corresponding to a preselected input signal magnitude and storing the complex gain coefficient in a look-up table; C) determining (46) a magnitude of the complex input signal and generating an index based on the magnitude of the complex input signal; D) using (47) the look-up table to output the complex gain coefficient corresponding to the index; and E) multiplying (48) the complex input signal and the complex gain coefficient to provide the predistorted drive signal. The preselected input signal magnitude is generally one of a plurality of preselected magnitude levels, wherein the preselected magnitude levels are selected stepwise based on voltage or a function of voltage.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A linearization system for providing a predistorted drive signal for a nonlinear transmission path, comprising:

A) an analog feedback system, coupled to a computation unit, for determining, during a training mode, a complex error signal that linearizes the nonlinear transmission path and wherein, in an operation mode, the analog feedback system is disabled; and B) a computation unit, coupled to the analog feedback system and coupled to receive a complex input signal and the complex error signal, for determining, during the training mode, complex predistortion gain coefficients and, during the operation mode, generating the predistorted drive signal for the nonlinear transmission path, wherein the analog feedback system and computation unit are interconnected by interface circuitry, wherein the computation unit includes:

C) a ratio determiner, coupled to the interface circuitry and to receive the complex input signal, for determining a complex look-up table coefficient corresponding to a preselected signal level;

D) a lookup encoder, coupled to receive the complex input signal, for determining a magnitude of the complex input signal and generating an index based on the magnitude of the complex input signal and a preselected set of levels;

E) a look-up table, coupled to the ratio determiner and the lookup encoder, for outputting the complex look-up table coefficient corresponding to the index; and F) a multiplier, coupled to receive the complex input signal and the complex look-up table coefficient, for multiplying the complex input signal and the complex look-up table coefficient to provide the predistorted drive signal.

2. The linearization system of claim 1 wherein the preselected set of levels is based on steps of the input signal magnitude.

3. A method for generating a predistorted drive signal for a nonlinear transmission path that includes a power amplifier, comprising the steps of:

A) utilizing an analog feedback system to determine a complex error signal that linearizes the nonlinear transmission path; and B) determining a magnitude of a complex input signal and generating a predistorted drive signal for the nonlinear transmission path that includes the power amplifier, wherein determining a magnitude of the complex input signal and generating a predistorted drive signal for the nonlinear transmission path includes:

C) converting the complex error signal to baseband digital format;

D) determining a complex gain coefficient corresponding to a preselected power level and storing the complex gain coefficient in a look-up table;

E) determining a magnitude of the complex input signal and generating an index based on the magnitude of the complex input signal and the preselected power level;

F) using the look-up table to output the complex gain coefficient corresponding to the index; and G) multiplying the complex input signal and the complex gain coefficient to provide the predistorted drive signal.

4. The method of claim 3 wherein a preselected set of power levels is based on steps of the input signal magnitude.

5. A radio having a linearization system for providing a predistorted drive signal for a nonlinear transmission path that includes a power amplifier, the linearization system comprising:

A) an analog feedback system that includes the nonlinear transmission path, coupled to the computation unit, for determining the complex error signal that linearizes the nonlinear transmission path; and B) a computation unit, coupled to the analog feedback system and coupled to receive a complex input signal and a complex error signal, for determining a magnitude of the complex input signal and generating the predistorted drive signal for the nonlinear transmission path that includes the power amplifier, wherein the computation unit includes:

C) a ratio determiner, coupled to the interface circuitry and to receive the complex input signal, for determining a complex look-up table coefficient corresponding to a preselected signal level;

D) a lookup encoder, coupled to receive the complex input signal, for determining a magnitude of the complex input signal and generating an index based on the magnitude of the complex input signal and a preselected set of levels;

E) a look-up table, coupled to the ratio determiner and the lookup encoder, for outputting the complex look-up table coefficient corresponding to the index; and F) a multiplier, coupled to receive the complex input signal and the complex look-up table coefficient, for multiplying the complex input signal and the complex look-up table coefficient to provide the predistorted drive signal.

* * * * *